(12) United States Patent
Lin

(10) Patent No.: US 9,479,150 B1
(45) Date of Patent: Oct. 25, 2016

(54) SELF-CALIBRATING MULTI-PHASE CLOCK CIRCUIT AND METHOD THEREOF

(71) Applicant: REALTEK SEMICONDUCTOR CORPORATION, Hsinchu (TW)

(72) Inventor: Chia-Liang (Leon) Lin, Fremont, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/804,582

(22) Filed: Jul. 21, 2015

(51) Int. Cl.
*H03H 11/16* (2006.01)
*H03K 5/13* (2014.01)
*H03K 5/135* (2006.01)
*H03K 5/00* (2006.01)

(52) U.S. Cl.
CPC ..... *H03K 5/135* (2013.01); *H03K 2005/00286* (2013.01)

(58) Field of Classification Search
CPC ............................. H03K 5/135; H03H 11/16
USPC ....................................................... 327/234
See application file for complete search history.

(56) References Cited

U.S. PATENT DOCUMENTS

| 8,164,493 B2* | 4/2012 | Hsieh | G04F 10/005 341/110 |
| 8,228,219 B2* | 7/2012 | Henzler | G04F 10/005 341/120 |
| 8,634,503 B2* | 1/2014 | Misek | H04L 7/0337 327/141 |

* cited by examiner

*Primary Examiner* — Lincoln Donovan
*Assistant Examiner* — Metasebia Retebo
(74) *Attorney, Agent, or Firm* — Sughrue Mion, PLLC

(57) ABSTRACT

A multi-phase clock circuit includes: a phase tuning circuit configured to receive a primitive N-phase clock including N primitive clocks of the same period but distinct phases and output a calibrated N-phase clock including N calibrated clocks in accordance with a first tuning signal, where N is integer greater than one; a clock multiplexing circuit configured to receive the N calibrated clocks and output a first output clock and a second output clock in accordance with a multiplexing control signal; a time-to-digital converter configured to receive the first output clock and the second output clock and output a digital code; and a calibration controller configured to receive the digital code and output the first tuning signal in accordance with a mode select signal.

18 Claims, 6 Drawing Sheets

SELF-CALIBRATING MULTI-PHASE CLOCK CIRCUIT AND METHOD THEREOF

BACKGROUND

1. Field

Apparatuses and methods consistent with exemplary embodiments generally relate to clocks, in particular multi-phase clocks.

2. Description of Related Art

Persons of ordinary skill in the art understand terms and basic concepts related to microelectronics that are used in this disclosure, such as "voltage," "signal," "logical signal," "clock," "phase," "period," "trip point," "inverter," "buffer," "propagation delay," and "multiplexer." Terms and basic concepts like these are apparent to those of ordinary skill in the art and thus will not be explained in detail here.

Through this disclosure, a logical signal is a signal of two states: "high" and "low," which can also be re-phrased as "1" and "0." For brevity, a logical signal in the "high" ("low") state is simply stated as the logical signal is "high" ("low"), or alternatively, the logical signal is "1" ("0"). Also, for brevity, quotation marks may be omitted, and the logical signal is simply stated as the logical signal is high (low), or alternatively, the logical signal is 1 (0), with the understanding that the statement is made in the context of describing a state of the logical signal. A logical signal is embodied by a potential voltage. The logical signal is "high" ("low") when the voltage is above (below) an associated trip point of a logical device that receives and processes the logical signal. For brevity, the associated trip point of a logical device is simply referred to as the trip point of the logical signal. In this disclosure, the trip point of a first logical signal may not be necessarily the same as the trip point of a second logical signal.

If a logical signal is "high" (or "1") it is said to be "asserted." If the logical signal is "low," it is said to be "de-asserted."

A clock signal is a signal having a period. For brevity, hereafter, "clock signal" is simply referred to as "clock."

A multi-phase clock includes a plurality of clocks of the same period and ideally, with uniformly displaced phases. For instance, an eight-phase 1 GHz clock includes eight clocks of the same period 1 ns but eight uniformly displaced phases: 0 degrees, 45 degrees, 90 degrees, 135 degrees, . . . , and 315 degrees. Concepts of "period" and "phase" associated with a "clock" are well understood to those of ordinary skill in the art and thus not explained in detail. In conventional practice, due to non-ideality of existing circuit embodiments, the plurality of clocks may not be uniformly displaced in phase or at least are not substantially uniformly displaced.

What is desired is a self-calibrating multi-phase clock circuit that can output a multi-phase clock of uniformly displaced phases.

BRIEF SUMMARY

An aspect of an exemplary embodiment is to calibrate a multi-phase clock by adjusting a propagation delay of the multi-phase clock in a closed loop manner to ensure that the multi-phase clock is properly positioned in time.

In an exemplary embodiment, a circuit includes: a phase tuning circuit configured to receive a primitive N-phase clock including N primitive clocks of the same period but distinct phases and output a calibrated N-phase clock including N calibrated clocks in accordance with a first tuning signal, where N is an integer greater than one; a clock multiplexing circuit configured to receive the N calibrated clocks and output a first output clock and a second output clock in accordance with a multiplexing control signal; a time-to-digital converter configured to receive the first output clock and the second output clock and output a digital code; and a calibration controller configured to receive the digital code and output the first tuning signal in accordance with a mode select signal. In an exemplary embodiment, the first tuning signal includes N delay control signals, and the phase tuning circuit includes N variable delay circuits configured to receive the N primitive clocks and output the N calibrated clocks in accordance with the N delay control signals, respectively. In an exemplary embodiment, the multiplexing control signal includes a first phase code and a second phase code, and the clock multiplexing circuit includes a first multiplexer configured to receive the N-phase calibrated clock and output the first output clock in accordance with the first phase code, and a second multiplexer configured to receive the N-phase calibrated clock and output the second output clock in accordance with the second phase code. In an exemplary embodiment, the calibration controller is configured to further receive a phase select signal. In an exemplary embodiment, when the mode select signal is of a first value, the calibrate controller is in a maintenance mode, wherein the first tuning signal is frozen and not adjusted. In an exemplary embodiment, when the mode select signal is of a second value, the calibration controller is in a first calibration mode, wherein: the calibration controller manipulates the multiplexing control signal, establishes statistics of the digital code with respect to the multiplexing control signal, and adapts the first tuning signal based on correlation between the statistics of the digital code and the multiplexing signal. In an exemplary embodiment, when the mode select signal is of a third value, the calibration controller is in a second calibration mode, wherein: the multiplexing control signal is set to the phase select signal, and the calibration controller establishes statistics of the digital code with respect to the phase select signal and adjusts the first tuning signal based on correlation between the statistics of the digital code and the phase select signal. In an exemplary embodiment, the calibration controller is configured to further output a second tuning signal including a logical signal and a delay adjustment signal, the clock multiplexing circuit is configured to further receive the second tuning signal, and the calibration controller adapts the delay adjustment signal based on correlation between the digital code and the logical signal. In an exemplary embodiment, the calibration controller de-asserts the logical signal and determines first statistics for the digital code and then asserts the logical signal and determines second statistics for the digital code, and adapts the delay adjustment signal based on one of the first statistics and the second statistics. In an exemplary embodiment, the clock multiplexing circuit is in a straight connection configuration when the logical signal is of a first state, and in a cross connection configuration when the logical signal is of a second state. In an exemplary embodiment, the time-to-digital converter is a noise-shaping time-to-digital converter.

In an exemplary embodiment, a method includes: receiving a primitive N-phase clock including N primitive clocks of the same period but distinct phases, wherein N is an integer greater than one; outputting a calibrated N-phase clock including N calibrated clocks by imposing propagation delay on the N primitive clocks in accordance with a first tuning signal including N delay control signals for controlling propagation delay on the N primitive clocks, respectively; outputting a first output clock by selecting among the N calibrated clocks in accordance with a first phase code; outputting a second output clock by selecting among the N calibrated clocks in accordance with a second phase code; converting a timing difference between the first output clock and the second output clock into a digital code using a time-to-digital converter; establishing statistics of the digital code with respect to the first phase code; and adjusting the first tuning signal in accordance with a correlation between the statistics of the digital code and the first phase code. In an exemplary embodiment, imposing propagation delay on the N primitive clocks includes incorporating N variable delay circuits controlled by the N delay control signals, respectively. In an exemplary embodiment, selecting among the N calibrated clocks in accordance with the first phase code includes using a first multiplexer controlled by the first phase code, and selecting among the N calibrated clocks in accordance with the second phase code includes using a second multiplexer controlled by the second phase code. In an exemplary embodiment, establishing statistics of the digital code with respect to the first phase code further includes: determining an average difference between the first output clock and the second output clock, and adjusting the first phase code depending on whether the average difference between the first output clock and the second output clock is positive or negative. In an exemplary embodiment, the method further includes: conditionally swapping the first output clock with the second output clock in accordance with a logical signal, and correcting an error in timing difference between the first output clock and the second output clock by adjusting a timing of the first output clock in accordance with a correlation between the digital code and the logical signal. A further exemplary embodiment includes: de-asserting the logical signal and determining first statistics for the digital code and then asserting the logical signal and determining second statistics for the digital code, and adjusting a delay adjustment to the N calibrated clocks determined in accordance with the first phase code based on one of the first statistics and the second statistics. In an exemplary embodiment, the time-to-digital converter is a noise-shaping time-to-digital converter.

DETAILED DESCRIPTION

An exemplary embodiment relates to calibration of a multi-phase clock. While the specification describes several exemplary embodiments considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the inventive concept.

The present disclosure is presented from an engineering viewpoint, wherein a first quantity is said to be "equal to" a second quantity if a difference between the first quantity and the second quantity is smaller than a given tolerance. For instance, 100.2 mV is said to be equal to 100 mV if the given tolerance is 0.5 mV. In other words, when it is stated: "X is equal to Y," it means: "X is approximately equal to Y, and a difference between X and Y is smaller than a given tolerance of interest." Likewise, in a mathematical expression, an equal sign "=" means "equal to, from the engineering viewpoint." Likewise, when it is stated: "uniformly displaced," it means: "displaced with uniformity better than specified." One skilled in the art would understand such specification.

Figure 1:
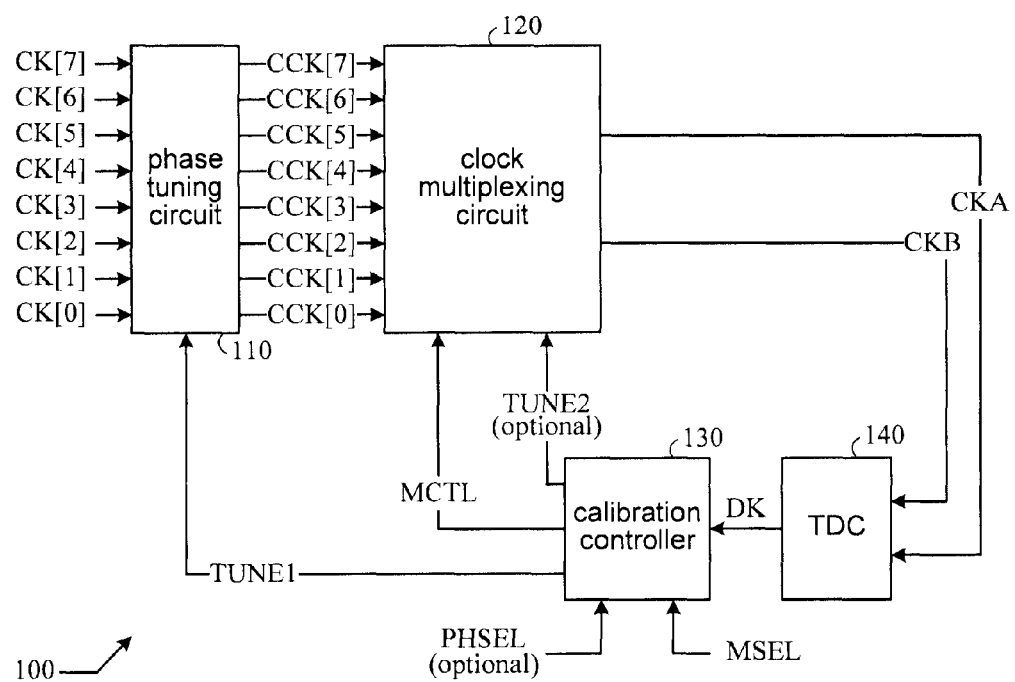
FIG. 1 shows a functional block diagram of a multi-phase clock circuit in accordance with an exemplary embodiment.

FIG. 1 shows a functional block diagram of a multi-phase clock circuit 100 in accordance with an exemplary embodiment. By way of example but not limitation, an eight-phase clock circuit is shown here. The multi-phase clock circuit 100 includes: a phase tuning circuit 110 configured to receive a primitive eight-phase clock CK[7:0] and output a calibrated eight-phase clock CCK[7:0] in accordance with a first tuning signal TUNE1; a clock multiplexing circuit 120 configured to receive the calibrated eight-phase clock CCK [7:0] and output a first output clock CKA and a second output clock CKB in accordance with a multiplexing control signal MCTL; a TDC (time-to-digital converter) 140 configured to receive the first output clock CKA and the second output clock CKB and output a digital code DK; and a calibration controller 130 configured to receive the digital code DK and output the first tuning signal TUNE1 and the multiplexing control signal MCTL in accordance with a mode select signal MSEL. In an exemplary embodiment, the calibration controller 130 can be optionally configured to further output a second tuning signal TUNE2, and the clock multiplexing circuit 120 can be optionally configured to further receive the second tuning signal TUNE2. In an another optional exemplary embodiment, the calibration controller 130 is configured to further receive a phase select signal PHSEL. For brevity, hereafter: the primitive eight-phase clock CK[7:0] is simply referred to as CK[7:0]; the calibrated eight-phase clock CCK[7:0] is simply referred to as CCK[7:0]; the phase select signal PHSEL is simply referred to as PHSEL; the first tuning signal TUNE1 is simply referred to as TUNE1; the second tuning signal TUNE2 is simply referred to as TUNE2, the first output clock CKA is simply referred to as CKA; the second output clock CKB is simply referred to as CKB; the digital code DK is simply referred to as DK; the mode select signal MSEL is simply referred to as MSEL; and the multiplexing control signal MCTL is simply referred to as MCTL. The respective phases of the primitive clock are indicated as CK[0]-CK[7], and respective phases of the calibrated clock are indicated as CCK[0]-CCK[7].

An overview of the multi-phase clock circuit 100 is described as follows. CK[7:0] includes eight clocks CK[0], CK[1], CK[2], ..., and CK[7] of the same period $T_{CK}$ but different phases. Ideally, CK[0], CK[1], CK[2], ..., and CK[7] are uniformly displaced in time with a timing difference of $T_{CK}/8$ between two adjacent clocks. That is, ideally, CK[0] (CK[1], CK[2], CK[3], CK[4], CK[5], CK[6], CK[7]) are respectively ahead of CK[1] (CK[2], CK[3], CK[4], CK[5], CK[6], CK[7], CK[0]) by a timing difference of $T_{CK}/8$. In practice, however, CK[7:0] may not be ideal and the timing difference between clocks may deviate from $T_{CK}/8$. A function of the multi-phase clock circuit 100 is to establish TUNE1 in a closed-loop manner so that CCK[7:0] are uniformly displaced in time, making CCK[7:0] a calibrated version of CK[7:0]. CKA and CKB are two adjacent clocks selected from CCK[7:0] in accordance with MCTL, and are used for calibration purpose to ensure that a timing difference between any two adjacent clocks of CCK[7:0] is $T_{CK}/8$. As a calibrated multi-phase clock, CCK[7:0] can be received and used by an application circuit (not shown in figure). CKA and CKB can also be received and used by the application circuit. TUNE2, if embodied, is used to calibrate a systematic timing error between CKA and CKB caused by a non-ideality of the clock multiplexing circuit 120. The multi-phase clock circuit 100 operates in at least two modes. When MSEL is 0, the multi-phase clock circuit 100 is in a maintenance mode wherein: TUNE1 and TUNE2 (if implemented) are frozen to either a default value (if no calibration has been conducted) or a calibrated value (if a calibration has been conducted), and MCTL is either frozen or determined by PHSEL (if implemented). When MSEL is 1, the multi-phase clock circuit 100 is in a first calibration mode wherein: PHSEL is ignored even if implemented, and the calibration controller 130 manipulates MCTL, observes how DK responds to MCTL, and adjusts TUNE1 accordingly so as to make DK independent of MCTL or to provide a more uniform difference in phase. This mode is useful if the application circuit does not need CKA or CKB during the calibration. In an exemplary embodiment, MSEL 2 can optionally include a setting state, and the multi-phase clock circuit 100 is placed in a second calibration mode wherein: MCTL is the same as PHSEL, which may be set by the application circuit, and the calibration controller 130 observes how DK responds to MCTL, and adjusts TUNE1 accordingly so as to make DK independent of MCTL. This mode is useful if the application circuit needs to receive CKA or CKB as specified by PHSEL during the calibration, and over the course of time, every possible value of PHSEL will occur for a sufficiently large number of occasions. A summary of the above description is shown in the table below:

| Value of MSEL | 0 | 1 | 2 (optional) |
|---|---|---|---|
| status of the calibration controller | maintenance | Calibration 1 | Calibration 2 |
| usage of PHSEL | to determine MCTL, if implemented | ignored, even if implemented | to determine MCTL |
| value of MCTL | frozen or determined by PHSEL (if implemented) | set by the calibration controller | the same as PHSEL |

Figure 2:
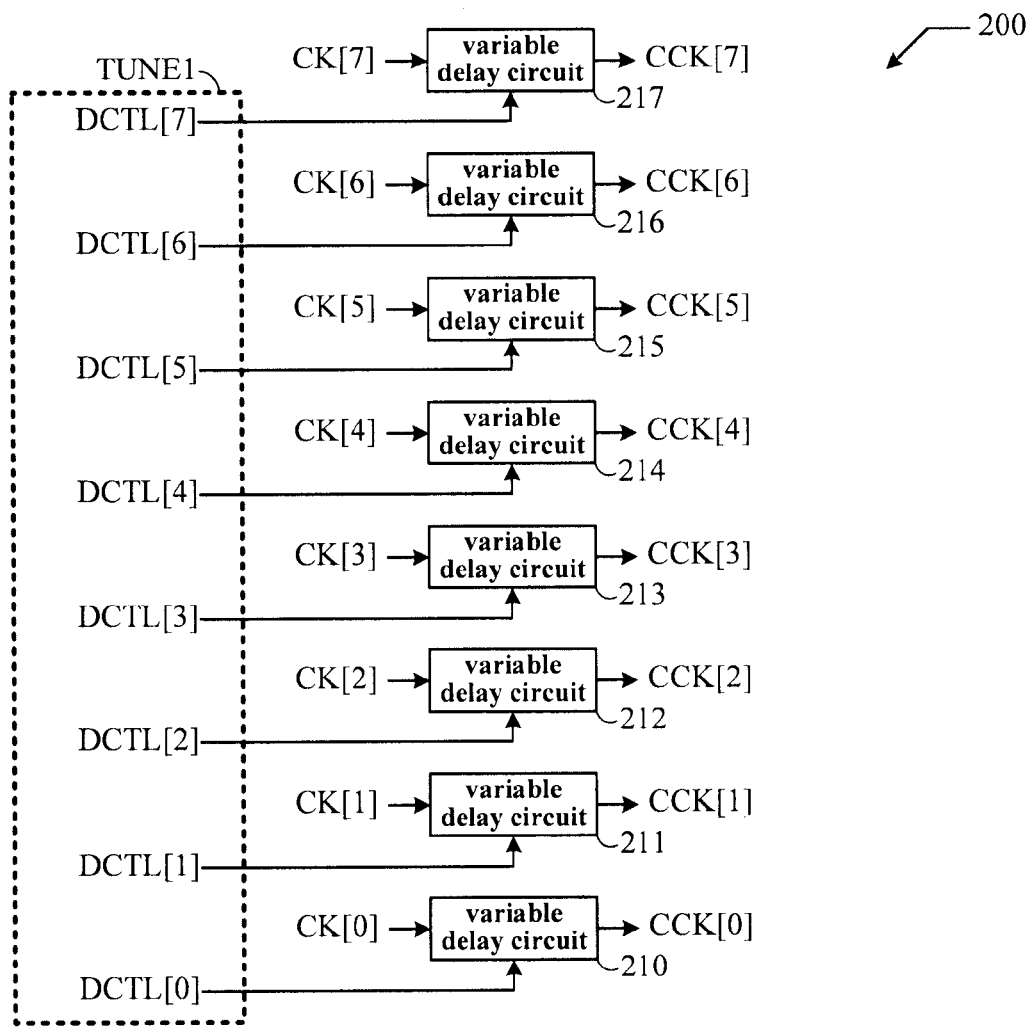
FIG. 2 shows a schematic diagram of a phase tuning circuit in accordance with an exemplary embodiment.
Figure 3:
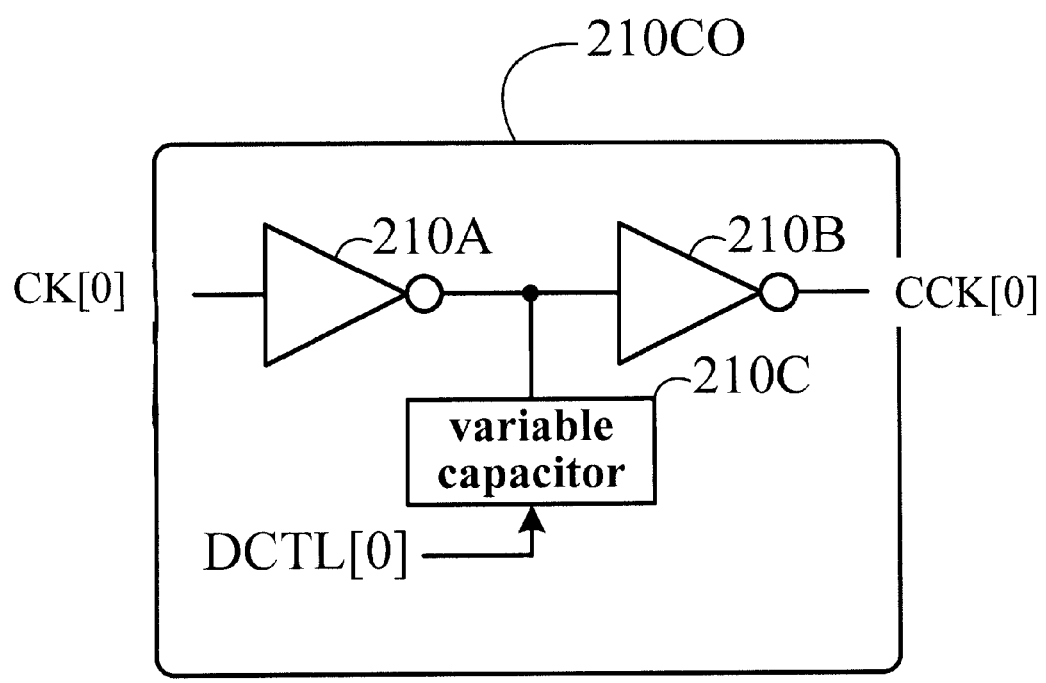
FIG. 3 shows a schematic diagram of a variable delay circuit illustrated in FIG. 2.

In accordance with an exemplary embodiment, FIG. 2 shows a schematic diagram of a phase tuning circuit 200 that can be used to embody the phase tuning circuit 110 of FIG. 1. The phase tuning circuit 200 includes: eight variable delay circuits 210~217 configured to receive CK[0]~CK[7] and output CCK[0]~CCK[7] in accordance with eight delay control signals DCTL[0]~DCTL[7], respectively. Here, the eight delay control signals DCTL[0]~DCTL[7] collectively embody the first tuning signal TUNE1. There are numerous circuits that can embody a variable delay circuit. An exemplary embodiment is shown in FIG. 3, wherein the variable delay circuit 210 includes two inverters 210A and 210B configured in a cascade topology, and a variable capacitor 210C, controlled by the respective delay control signal DCTL[0]. The cascade of inverters 210A and 210B form a buffer that receives and propagates CK[0], resulting in CCK[0], while a propagation delay is determined by a capacitance of the variable capacitor 210C controlled by the delay control signal DCTL[0], wherein a greater capacitance of the variable capacitor 210C leads to a greater propagation delay. Inverters and variable capacitors can be implemented in various forms and are well known to those of ordinary skill in the art and thus not described in detail here. The remaining variable delay circuits 211-217 have a similar arrangement of buffers and capacitors to process respective CK signals in accordance with respective DCTL signals to output respective CCK signals. In an exemplary embodiment, a greater value of DCTL[0] (DCTL[1], DCTL[2], ..., DCTL[7]) leads to a greater propagation delay of the variable delay circuit 210 (211, 212, ..., 217). By way of example but not limitation, the variable delay circuit 210 (211, 212, ..., 217) has a minimum propagation delay of 100 ps when DCTL[0] (DCTL[1], DCTL[2], ..., DCTL[7]) is set to a minimum value, has a maximum propagation delay of 200 ps when DCTL[0] (DCTL[1], DCTL[2], ..., DCTL[7]) is set to a maximum value, and has a medium propagation delay of 150 ps when DCTL[0] (DCTL[1], DCTL[2], ..., DCTL[7]) is set to a medium value. A function of the multi-phase clock circuit 100 is to properly establish the eight delay control signals DCTL[0]~DCTL[7] such that CCK[7:0] are uniformly displaced in time, even though CK[7:0] are not. An exemplary algorithm of establishing DCTL[0]~DCTL[7] will be disclosed later in this disclosure.

Figure 4:
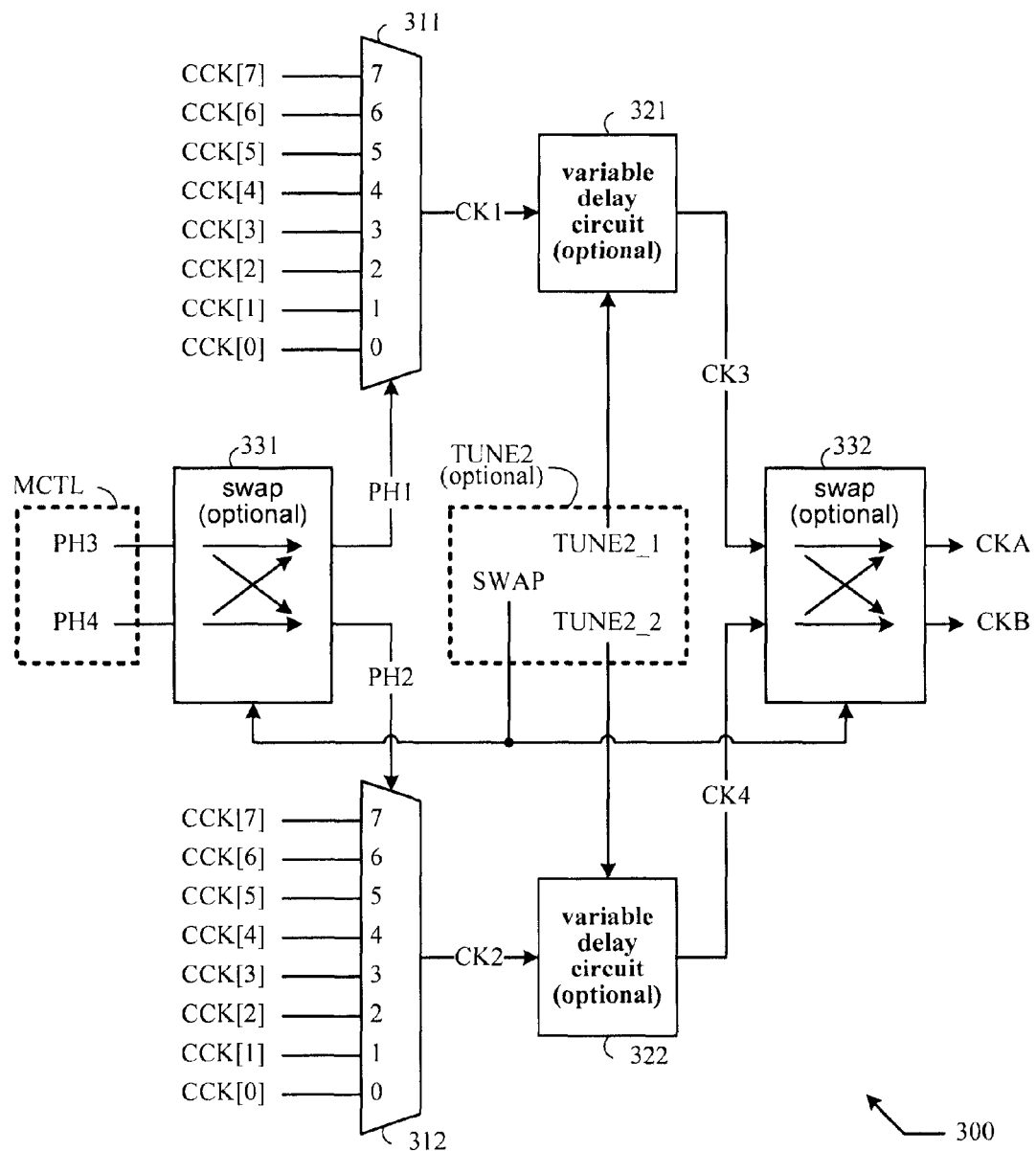
FIG. 4 shows a schematic diagram of a clock multiplexing circuit in accordance with an exemplary embodiment.

In accordance with an exemplary embodiment, FIG. 4 shows a schematic diagram of a clock multiplexing circuit 300 that can be used to embody the clock multiplexing circuit 120 of FIG. 1. The clock multiplexing circuit 300 includes: a first multiplexer 311 configured to receive CCK[7:0] and output a first intermediate clock CK1 in accordance with a first phase code PH1; a second multiplexer 312 configured to receive CCK[7:0] and output a second intermediate clock CK2 in accordance with a second phase code PH2; a first variable delay circuit 321 configured to receive the first intermediate clock CK1 and output a third intermediate clock CK3 in accordance with a first intermediate delay control signal TUNE2_1; a second variable delay circuit 322 configured to receive the second intermediate clock CK2 and output a fourth intermediate clock CK4 in accordance with a second intermediate delay control signal TUNE2_2; a first swap circuit 331 configured to receive a third phase code PH3 and a fourth phase code PH4 and output the first phase code PH1 and the second phase code PH2 in accordance with a swap signal SWAP; and a second swap circuit 332 configured to receive the third intermediate clock CK3 and the fourth intermediate clock CK4 and output CKA and CKB in accordance with the swap signal SWAP. For brevity, hereafter, the first intermediate clock CK1 is simply referred to CK1; the second intermediate clock CK2 is simply referred to CK2; the third intermediate clock CK3 is simply referred to CK3; the fourth intermediate clock CK4 is simply referred to CK4; the first phase code PH1 is simply referred to PH1; the second phase code PH2 is simply referred to PH2; the third phase code PH3 is simply referred to PH3; the fourth phase code PH4 is simply referred to PH4; the first intermediate delay control signal TUNE2_1 is simply referred to as TUNE2_1; the second intermediate delay control signal TUNE2_2 is simply referred to as TUNE2_2; and the swap signal SWAP is simply referred to as SWAP.

When PH1 is 0 (1, 2, 3, 4, 5, 6, 7), respectively, the first multiplexer 311 respectively selects CCK[0] (CCK[1], CCK[2], CCK[3], CCK[4], CCK[5], CCK[6], CCK[7]) to output CK1. Likewise, when the PH2 is 0 (1, 2, 3, 4, 5, 6, 7), respectively, the second multiplexer 312 respectively selects CCK[0] (CCK[1], CCK[2], CCK[3], CCK[4], CCK[5], CCK[6], CCK[7]) to output CK2. By design, CK3 (CK4) is the same as CK1 (CK2) except for a propagation delay caused by the first (second) variable delay circuit 321 (322) determined by TUNE2_1 (TUNE2_2). When SWAP is de-asserted (asserted), PH1 is equal to PH3 (PH4), PH2 is equal to PH4 (PH3), CKA is equal to CK3 (CK4), and CKB is equal to CK4 (CK3). In other words, when SWAP is de-asserted, the first swap circuit 331 and the second swap circuit 332 are in a "straight connection" configuration; when SWAP is asserted, the first swap circuit 331 and the second swap circuit 332 are in a "cross connection" configuration, wherein an act of swapping takes place. Multiplexers and swap circuits are all well known to those of ordinary skill in the art and thus not described in detail here. Variable delay circuits have been described in this disclosure. PH3 and PH4 together form the multiplexing control signal MCTL, while TUNE2_1, TUNE2_2, and SWAP together form the second tuning signal TUNE2.

CKA and CKB are selected from two adjacent clocks of CCK[7:0]. In an exemplary embodiment, PH4 is equal to PH3+1, that is, PH4 is 1 (2, 3, 4, 5, 6, 7, 0) when PH3 is 0 (1, 2, 3, 4, 5, 6, 7). Note that an eight-phase clock has a modulo-8 nature, wherein a wrap-around occurs when a phase index rises above 7 or falls below 0; that's why PH4 is 0 when PH3 is 7 even though PH4 is equal to PH3+1.

The two variable delay circuits 321 and 322, and the two swap circuits 331 and 332 (along with TUNE2 and SWAP) are all optional. If they are not implemented, PH1 (PH2) is the same PH3 (PH4), and CK1 (CK2) is the same as CKA (CKB). These optional circuits are useful when there is an otherwise mismatch in propagation delay between a first path, from CCK[7:0] to CKA through the first multiplexer 311, and a second path, from CCK[7:0] to CKB through the second multiplexer 312. When these optional circuits are implemented, the second tuning signal TUNE2 is established such that a propagation delay of a first calibrated path, from CCK[7:0] to CK3 through the first multiplexer 311 and the first variable delay circuit 321, is equal to a propagation delay of a second calibrated path, from CCK[7:0] to CK4 through the second multiplexer 312 and the second variable delay circuit 322. In other words, the mismatch is corrected by the two variable delay circuits 321 and 322. When SWAP is de-asserted (asserted), CKA comes from the first (second) calibrated path in accordance with PH3, while CKB comes from the second (first) calibrated path in accordance with PH4. When the first calibrated path matches well with the second calibrated path in propagation delay, CKA and CKB are determined by PH3 and PH4, respectively, and not affected by SWAP. The second tuning signal TUNE2 is adapted so that SWAP makes no difference to CKA and CKB. An algorithm of establishing TUNE2 will be disclosed later in this disclosure.

TDC 140 receives CKA and CKB and outputs DK to represent a timing difference between CKA and CKB. Time-to-digital converters are known to those of ordinary skill in the art and thus not described in detail here. If CCK[0], CCK[1], CCK[2], . . . , are CCK[7] are uniformly displaced in time, the timing difference between CKA and CKB will always be $T_{CK}/8$, regardless of which two adjacent clocks are selected by MCTL, and therefore a mean value of DK should be independent of the value of MCTL. If a change of the value of MCTL leads to a change in the mean value of DK, it suggests a non-uniformity of CCK[7:0] and an adjustment is needed.

The calibration controller 130 works in accordance with the mode select signal MSEL. When MSEL is 1, the calibration controller 130 performs a calibration based on an algorithm 400A described by a flow diagram shown in FIG. 5A in accordance with an exemplary embodiment. Upon a start (step 401) of a calibration process, a plurality of steps are taken in a measurement phase 410A, followed by a plurality of steps taken in an adjustment phase 420 before an end (step 402) of the calibration process. The measurement phase 410A includes the following steps: initialize PH3 and PH4 to 0 and 1, respectively (step 411); determine MDK[PH3], which denotes a mean value of DK over 1024 samples (step 412); increment both PH3 and PH4 (step 413); check the value of PH3 (step 414); if PH3 is 0, move on to the adjustment phase 420, else loop back to step 412. The adjustment phase 420 includes the following steps: initialize an internal variable K to 1 (step 421); adjust DCTL[K] in accordance with MDK[K]-MDK[K−1] (step 422); increment K (step 423); check the value of K (step 424); if K is 0, the present calibration process is finished (step 402), else loop back to step 422. A principle of algorithm 400A is explained in the following paragraph. Note that 1024 samples are by way of example but not limitation; 1024 samples are a sample based that in an exemplary embodiment is considered sufficiently large for reliable statistics.

Consider the case where the two variable delay circuits 321 and 322 and the two swap circuits 331 and 332 are not implemented (see FIG. 4). Since the mean value of DK MDK[1] is determined by setting PH3 to 1 and PH4 to 2, MDK[1] represents a mean value of a timing difference between CCK[2] and CCK[1] Likewise, MDK[0] represents a mean value of a timing difference between CCK[1] and CCK[0]. If MDK[1] is greater (smaller) than MDK[0], it suggests that, as far as timing is concerned, CCK[1] is closer to CCK[0] (CCK[2]) than to CCK[2] (CCK[0]). Then, it is clear that by an increase (decrease) of a delay on CCK[1] is needed, and therefore, DCTL[1] needs to be incremented (decremented) to introduce a greater (smaller) delay on CCK[1] (see FIG. 2). Therefore, DCTL[K] is incremented (decremented) if MDK[K]-MDK[K−1] is positive (negative), for K=1, 2, 3, . . . , 7. Since CCK[0] is used as a reference clock, the timing of CCK[0] does not need to be adjusted. In an exemplary embodiment, DCTL[0] is fixed at a medium value so that CCK[0] has a fixed, medium delay. Note that PH3, PH4, and the internal variable K are all of modulo-8 nature (due to an eight-phase clock here). Therefore, when K is 7, incrementing K will make K equal to 0.

Figure 5A:
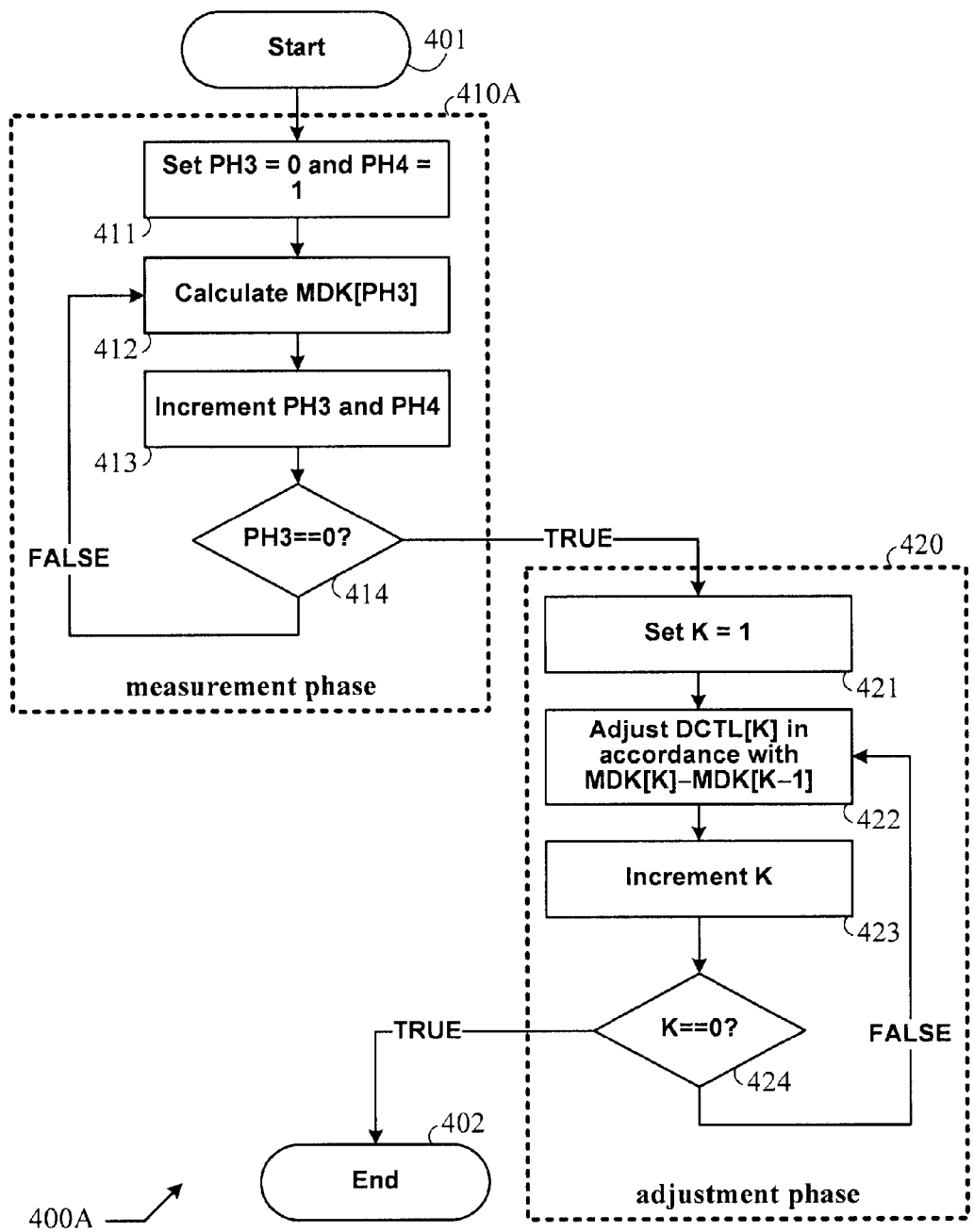
FIG. 5A shows a flow diagram of an exemplary algorithm of calibration for the multi-phase clock circuit of FIG. 1.
Figure 5B:
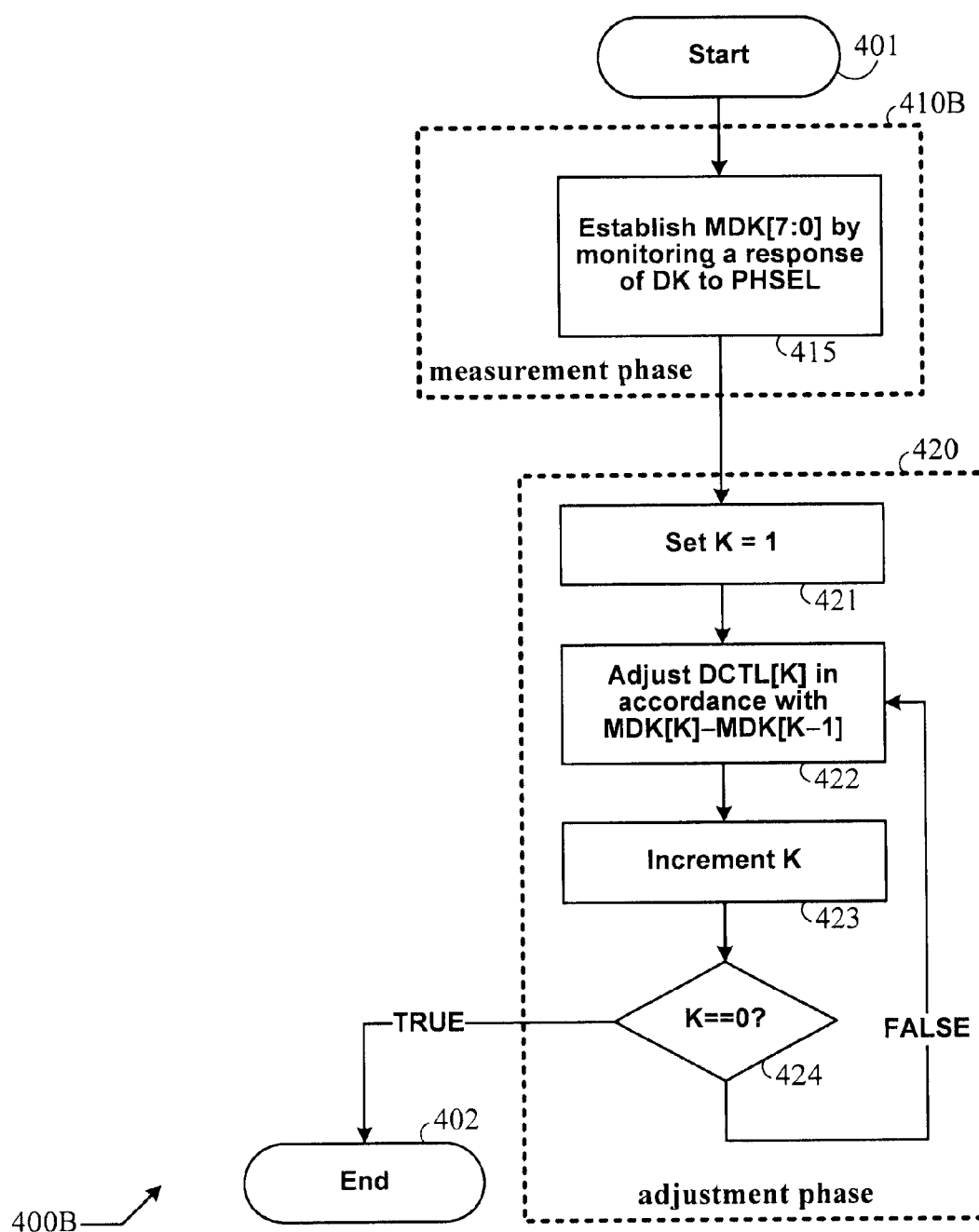
FIG. 5B shows a flow diagram of an another exemplary algorithm of calibration for the multi-phase clock circuit of FIG. 1.

When MSEL is 2, calibration controller 130 performs a calibration based on an algorithm 400B described by a flow diagram shown in FIG. 5B in accordance with an exemplary embodiment. Algorithm 400B is the same as algorithm 400A of FIG. 5A, except that the measurement phase 410A of FIG. 5A is replaced by the measurement phase 410B in FIG. 5B. When MSEL is 2, MCTL and thus PH3 and PH4 are determined by PHSEL, which may be controlled by the application circuit of CKA and CKB. In this case, the calibration controller 130 cannot manipulate PH3 and PH4, but can only observe passively how DK responds to PH3 and PH4. In the measurement phase 410B, the calibration controller 130 establishes MDK[7:0] by monitoring a response of DK to PHSEL (step 415). In an exemplary embodiment, when MSEL is 2, PH3 is equal to PHSEL, and PH4 is equal to PHSEL+1. In an exemplary embodiment, the calibration controller 130 includes eight counters (not shown) CTR0, CTR1, CTR2, . . . , and CTR7, and eight accumulators (not shown) ACC0, ACC1, ACC2, . . . , and ACC7, for monitoring DK when PHSEL is 0, 1, 2, . . . , and 7, respectively.

The eight counters and the eight accumulators are all initialized to zero. Upon entering the measurement phase 410B, for each sample of DK, the counter and the accumulator associated with the value of PHSEL is updated, that is: if PHSEL is 0 (1, 2, . . . , 7), then CTR0 (CTR1, CTR2, . . . , CTR7) is incremented, i.e. CTR0=CTR0+1 (CTR1=CTR1+1, CTR2=CTR2+1, . . . , CTR7=CTR7+1), and the value of DK is accumulated into ACC0 (ACC1, ACC2, . . . , ACC7), i.e. ACC0=ACC0+DK (ACC1=ACC1+ DK, ACC2=ACC2+DK, . . . , ACC7=ACC7+DK). As long as every value of PHSEL occurs for a sufficiently large number of occasions (e.g., 1024 times), MDK[0] (MDK[1], MDK[2], . . . , MDK[7]) is equal to a value of ACC0 (ACC1, ACC2, . . . , ACC7) divided by a value of CTR0 (CTR1, CTR2, . . . , CTR7), that is, MDK[0]=ACC0/CTR0 (MDK [1]=ACC1/CTR1, MDK[2]=ACC2/CTR2, . . . , MDK[7]= ACC7/CTR7). Once MDK[7:0] are obtained, algorithm 400B moves on to the adjustment phase 420, just like algorithm 400A of FIG. 5A.

Note that calibration, using either algorithm 400A of FIG. 5A or algorithm 400B of FIG. 5B can be performed repeatedly.

In an optional exemplary embodiment, the calibration controller 130 adjusts TUNE2 so as to correct an error of the clock multiplexing circuit 120 using an algorithm described as follows. Now refer to FIG. 4. The calibration controller 130 de-asserts SWAP, and determines a first mean value of DK while SWAP is being de-asserted. Then, the calibration circuit 130 asserts SWAP, and determines a second mean value of DK while SWAP is being asserted. If the first mean value is greater (smaller) than the second mean value, it indicates that the first calibrated path, from CCK[7:0] to CK3 through the first multiplexer 311 and the first variable delay circuit 321 has a shorter (longer) propagation delay than the second calibrated path, from CCK[7:0] to CK4 through the second multiplexer 312 and the second variable delay circuit 322; then the calibration controller 130 increases (decreases) a value of TUNE2_1 to increase (decrease) the propagation delay of the first calibrated path. TUNE2_2, on the other hand, is fixed at a medium value that leads to a medium propagation delay for the second calibrated path. The mismatch in propagation delay between the first calibrated path and the second calibrated path are therefore corrected in a closed loop manner.

In an exemplary embodiment, TDC 140 of FIG. 1 is a noise-shaping time-to-digital converter, wherein a quantization noise is spectrally shaped so that a mean value of DK is a very accurate representation of a timing difference between CKA and CKB. A noise-shaping time-to-digital converter, for instance, can be based on using gated ring oscillator as taught by Straayer et al. in U.S. Pat. No. 8,138,843. Time-to-digital converters, however, are usually limited in processing speed and may not be able to handle CKA and CKB if the period $T_{CK}$ is very short. To overcome the limitation in processing speed, in an exemplary embodiment, CKA and CKB are divided down to a lower speed that TDC 140 can handle. By way of example but not limitation: the period $T_{CK}$ is 100 ps, and CKA and CKB are divided down by using a divide-by-64 counter, resulting in two divided down clocks CKA' and CKB' of a longer period 6400 ps that can be comfortably handled by TDC 140. A divide-by-64 counter is well known in prior art and thus not described in detail here.

Those skilled in the art will readily observe that numerous modifications and alterations of the device and method may be made while retaining the teachings of the inventive concept. Accordingly, the above disclosure should be construed as limited only by the metes and bounds of the appended claims and their equivalents.

What is claimed is:

1. A circuit comprising:
   a phase tuning circuit configured to receive a primitive N-phase clock comprising N primitive clocks of the same period but distinct phases and output a calibrated N-phase clock comprising N calibrated clocks in accordance with a first tuning signal, where N is an integer greater than one;
   a clock multiplexing circuit configured to receive the N calibrated clocks and output a first output clock and a second output clock in accordance with a multiplexing control signal;
   a time-to-digital converter configured to receive the first output clock and the second output clock and output a digital code; and
   a calibration controller configured to receive the digital code and output the first tuning signal in accordance with a mode select signal.

2. The circuit of claim 1, wherein: the first tuning signal comprises N delay control signals, and the phase tuning circuit comprises N variable delay circuits configured to receive the N primitive clocks and output the N calibrated clocks in accordance with the N delay control signals, respectively.

3. The circuit of claim 1, wherein: the multiplexing control signal comprises a first phase code and a second phase code, and the clock multiplexing circuit comprises a first multiplexer configured to receive the N-phase calibrated clock and output the first output clock in accordance with the first phase code, and a second multiplexer configured to receive the N-phase calibrated clock and output the second output clock in accordance with the second phase code.

4. The circuit of claim 1, wherein: when the mode select signal is a first value, the calibration controller is in a maintenance mode, wherein the first tuning signal is frozen and not adjusted.

5. The circuit of claim 4, wherein: when the mode select signal is a second value, the calibration controller is in a first calibration mode, wherein: the calibration controller manipulates the multiplexing control signal, establishes statistics of the digital code with respect to the multiplexing control signal, and adapts the first tuning signal based on correlation between the statistics of the digital code and the multiplexing signal.

6. The circuit of claim 1, wherein: the calibration controller is configured to further receive a phase select signal.

7. The circuit of claim 5, wherein: when the mode select signal is of a third value, the calibration controller is in a second calibration mode, wherein: the multiplexing control signal is set to a phase select signal, and the calibration controller establishes statistics of the digital code with respect to the phase select signal and adapts the first tuning signal based on correlation between the statistics of the digital code and the phase select signal.

8. The circuit of claim 1, wherein the calibration controller is configured to further output a second tuning signal comprising a logical signal and a delay adjustment signal, the clock multiplexing circuit is configured to further receive the second tuning signal, and the calibration controller adapts the delay adjustment signal based on correlation between the digital code and the logical signal.

9. The circuit of claim 8, wherein the calibration controller de-asserts the logical signal and determines first statistics for the digital code and then asserts the logical signal and determines second statistics for the digital code, and adapts the delay adjustment signal based on one of the first statistics and the second statistics.

10. The circuit of claim 8, wherein the clock multiplexing circuit is in a straight connection configuration when the logical signal is of a first state, and in a cross connection configuration when the logical signal is of a second state.

11. The circuit of claim 1, wherein the time-to-digital converter is a noise-shaping time-to-digital converter.

12. A method comprising:
receiving a primitive N-phase clock comprising N primitive clocks of the same period but distinct phases, wherein N is an integer greater than one;
outputting a calibrated N-phase clock comprising N calibrated clocks by imposing propagation delay on the N primitive clocks in accordance with a first tuning signal comprising N delay control signals for controlling propagation delay on the N primitive clocks, respectively;
outputting a first output clock by selecting among the N calibrated clocks in accordance with a first phase code;
outputting a second output clock by selecting among the N calibrated clocks in accordance with a second phase code;
converting a timing difference between the first output clock and the second output clock into a digital code using a time-to-digital converter;
establishing statistics of the digital code with respect to the first phase code; and
adjusting the first tuning signal in accordance with a correlation between the statistics of the digital code and the first phase code.

13. The method of claim 12, wherein imposing propagation delay on the N primitive clocks comprises incorporating N variable delay circuits controlled by the N delay control signals, respectively.

14. The method of claim 12, wherein selecting among the N calibrated clocks in accordance with the first phase code comprises using a first multiplexer controlled by the first phase code, and selecting among the N calibrated clocks in accordance with the second phase code comprises using a second multiplexer controlled by the second phase code.

15. The method of claim 12, wherein establishing statistics of the digital code with respect to the first phase code further comprises determining an average difference between the first output clock and the second output clock, and adjusting the first phase code depending on whether the average difference between the first output clock and the second output clock is positive or negative.

16. The method of claim 12 further comprising: conditionally swapping the first output clock with the second output clock in accordance with a logical signal, and correcting an error in timing difference between the first output clock and the second output clock by adjusting a timing of the first output clock in accordance with a correlation between the digital code and the logical signal.

17. The method according to claim 16, further comprising de-asserting the logical signal and determining first statistics for the digital code and then asserting the logical signal and determining second statistics for the digital code, and adjusting a delay adjustment to the N calibrated clocks determined in accordance with the first phase code based on one of the first statistics and the second statistics.

18. The method of claim 12, wherein the time-to-digital converter is a noise-shaping time-to-digital converter.

* * * * *